(12) United States Patent
Tang et al.

(10) Patent No.: US 6,504,216 B1
(45) Date of Patent: Jan. 7, 2003

(54) ELECTROSTATIC DISCHARGE PROTECTIVE CIRCUIT

(75) Inventors: Tien-Hao Tang, Taipei Hsien (TW); Chen-Chung Hsu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/624,170

(22) Filed: Jul. 24, 2000

(30) Foreign Application Priority Data

Apr. 19, 2000  (TW) ........................... 89107355 A

(51) Int. Cl.[7] ............................................. H01L 23/62
(52) U.S. Cl. ..................... 257/355; 257/356; 257/357; 257/360; 257/365; 257/368; 257/510; 257/524
(58) Field of Search .................................. 257/355, 356, 257/357, 360, 365, 368, 510, 524

(56) References Cited

U.S. PATENT DOCUMENTS 5,914,517 A  *  6/1999  Konogi ........................ 257/374
6,054,736 A  *  4/2000  Shigehara et al. ........... 257/336
6,064,095 A  *  5/2000  Fu .............................. 257/355

FOREIGN PATENT DOCUMENTS

| EP | 0 747 966 A2 | * | 5/1996 |
| JP | 56-27969 | * | 3/1981 |
| JP | 402036564 A | * | 2/1990 |

* cited by examiner

Primary Examiner—Nathan J. Flynn
Assistant Examiner—Ahmed N. Sefer

(57) ABSTRACT

An electrostatic discharge protective circuit. The electrostatic discharge protective circuit includes a gate electrode. A drain is formed at one side of the gate electrode. A source is formed at another side of the gate electrode, wherein the gate electrode, the drain and the source together form a transistor. A plurality of isolation structures penetrates through the gate electrode and respectively isolates the drain and the source into a plurality of drain regions and source regions. A plurality of contacts is respectively formed on the gate electrode, the drain regions and the source regions, wherein each drain region and each source region respectively have at least one contact.

16 Claims, 3 Drawing Sheets

ELECTROSTATIC DISCHARGE PROTECTIVE CIRCUIT

BACKGROUND OF THE INVENTION

1. Field of the Invention

The present invention relates to an electrostatic discharge protective circuit. More particularly, the present invention relates to an electrostatic discharge protective circuit having a transistor with several isolation structures.

2. Description of the Related Art

Electrostatic discharge (ESD) is one of the major sources of integrated circuit (IC) damage in an IC fabrication process. This is especially true for fabrication of a deep sub-micron IC. In order to overcome the problems caused by static electricity, an ESD protective circuit is incorporated on the input/output (I/O) pads of a complementary metal-oxide-semiconductor (CMOS) IC through an on-chip method.

FIG. 1A and FIG. 1B are schematic circuit diagrams of conventional ESD protective circuits. As shown in FIG. 1A, in order to protect the internal circuit 10, the internal circuit 10 is electrically coupled to the pads (not shown) through an NMOS. The ESD current imported through an input port INP is discharged through the NMOS transistor NI to a ground $V_{SS}$. FIG. 1B is a schematic circuit diagram of another conventional ESD protective circuit. As shown in FIG. 1B, in order to protect the internal circuit 10, the ESD current can be discharged not only through an NMOS transistor N1 to the ground $V_{SS}$ but also through a PMOS transistor PI to a voltage source $V_{DD}$.

FIG. IC is a schematic, top view of a transistor in a conventional ESD protective circuit. A transistor 106 mainly comprises a gate electrode 100, a drain region 102 and a source region 104, wherein the drain region 102 and the source region 104 are respectively formed at each side of the gate electrode 100. There are several contacts 108 respectively formed on the gate electrode 100, the drain region 102 and the source region 104. The contacts 108 are used as conductive media to respectively connect the external pads (not shown), the ground Vss (as shown in FIGS. 1A and 1B) and the voltage source $V_{DD}$ (as shown in FIG. 1B) to the gate electrode 100, the drain region 102 and the source region 104. As a current is induced by electrostatic discharge, the current flows to the drain region 102 via the contacts 108. The current then passes through channels (not shown) controlled by the gate electrode 100 of the transistor 106 and reaches to the source region 104. Thereafter, the current flows to the ground (not shown) or to a voltage source line (not shown) via the contacts 108 on the source region 104.

However, the transistor 106 mentioned above has several disadvantages. When the gate electrode 100 is nonuniform, some of the channels may open relatively early. Moreover, when some of the channels have defects, the current induced by the electrostatic discharge will excessively focus at those channels or at the defects. Therefore, the massive current passes through only a portion of the transistor and the temperature of that portion of the transistor is high. Hence, the IC is damaged. Additionally, since the current does not flow through other channels, the efficiency of the ESD protective circuit is poor.

SUMMARY OF THE INVENTION

The invention provides an electrostatic discharge protective circuit. By using the invention, the current induced by the electrostatic discharge can uniformly flow from the drain to the source. The damage of the IC caused by excessively focused current can be avoided. Additionally, the effect of the electrostatic discharge protective circuit can be greatly improved.

To achieve these and other advantages and in accordance with the purpose of the invention, as embodied and broadly described herein, the invention provides an electrostatic discharge protective circuit. The electrostatic discharge protective circuit includes a gate electrode. A drain is formed at one side of the gate electrode. A source is formed at another side of the gate electrode, wherein the gate electrode, the drain and the source together form a transistor. A plurality of isolation structures penetrates through the gate electrode and respectively isolates the drain and the source into a plurality of drain regions and source regions. A plurality of contacts is respectively formed on the gate electrode, the drain regions and the source regions, wherein each drain region and each source region respectively has at least one contact.

The invention provides an electrostatic discharge protective circuit. The electrostatic discharge protective circuit includes a gate electrode. A drain is formed at one side of the gate electrode. A source is formed on another side of the gate electrode, wherein the gate electrode, the drain and the source together form a transistor. A plurality of isolation structures penetrates through the gate electrode, isolates the source into a plurality of source regions and extends into a portion of the drain from both sides of the drain. A plurality of contacts is respectively formed on the gate electrode, the drain regions and the source regions, wherein each drain region and each source region respectively has at least one contact. Since the isolation structures electrically isolate the drain regions from each other, the currents cannot flow to each other between every drain region. Thereafter, the currents flow to each source region from the respective drain regions. Hence, the current induced by the electrostatic discharge does not excessively focus at some contacts in the source. Because the current uniformly flows through the drain regions, the local high temperature effect of the transistor and the damage to the IC can be avoided. Furthermore, since the current flows from the drain to the source through most of the channels, the effect of the ESD protective circuit can be greatly enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
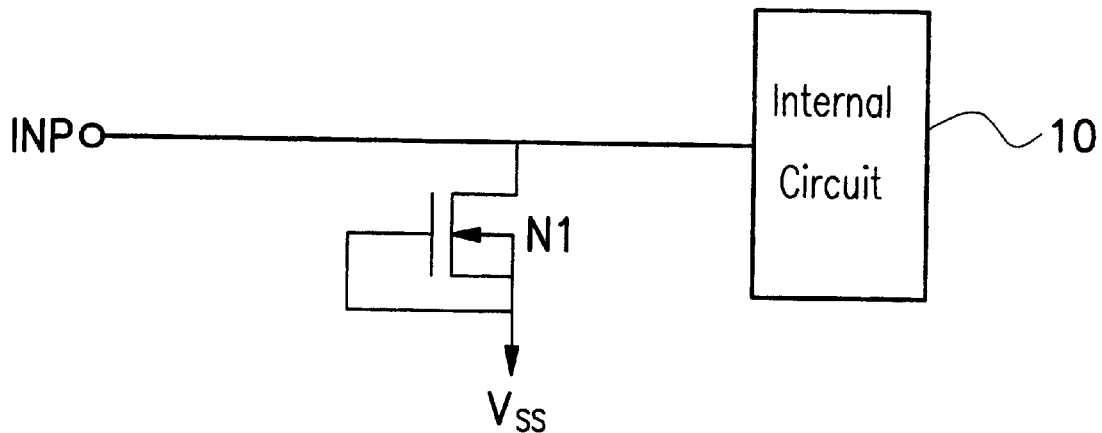
FIG. 1A is a schematic circuit diagram of a conventional ESD protective circuit.
Figure 1B:
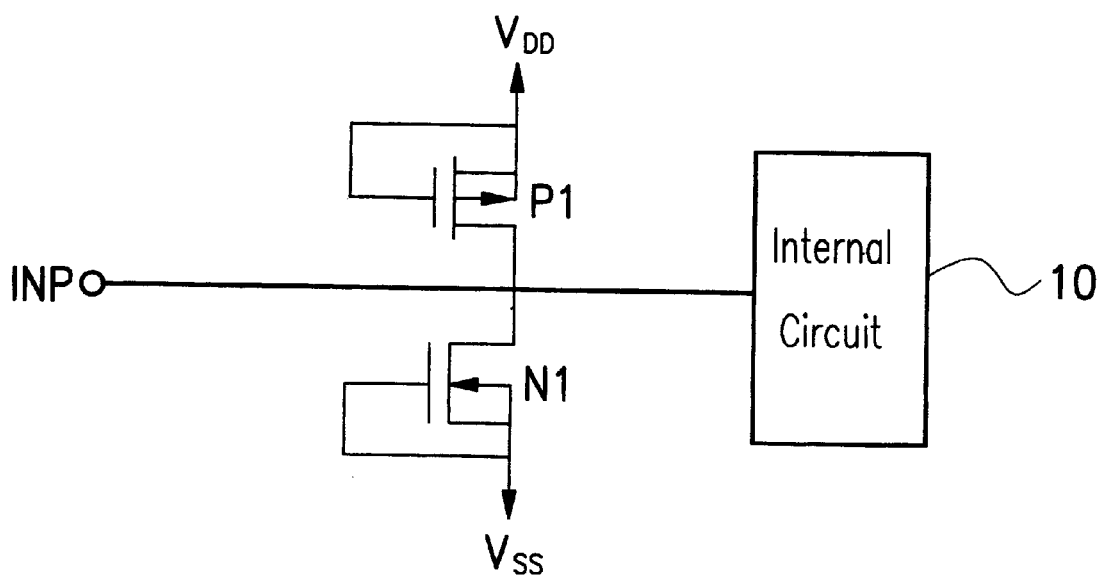
FIG. 1B is a schematic circuit diagram of a conventional ESD protective circuit.
Figure 1C:
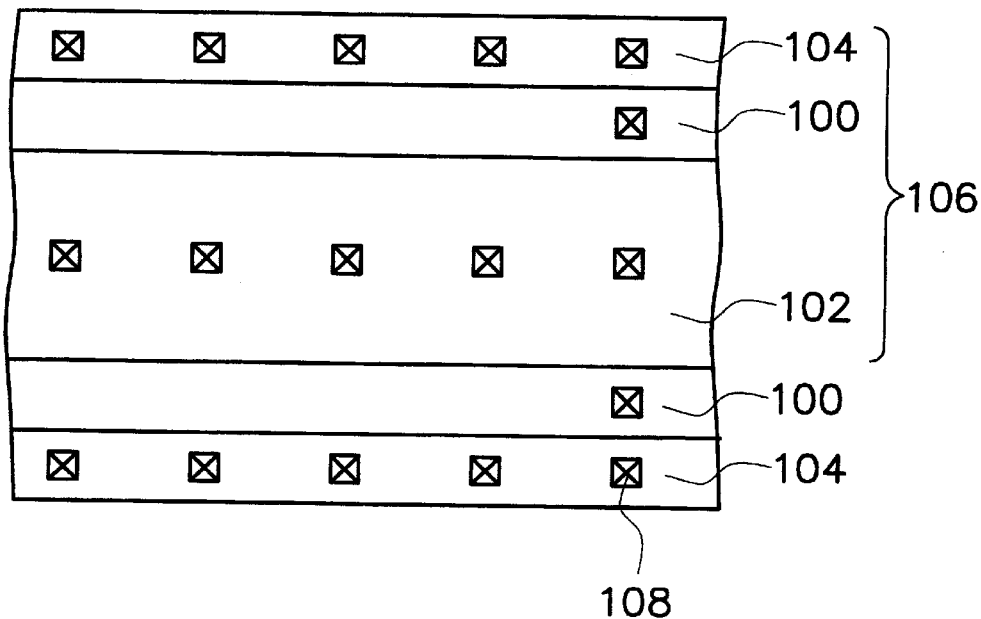
FIG. 1C is a schematic, top view of a transistor in a conventional ESD protective circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
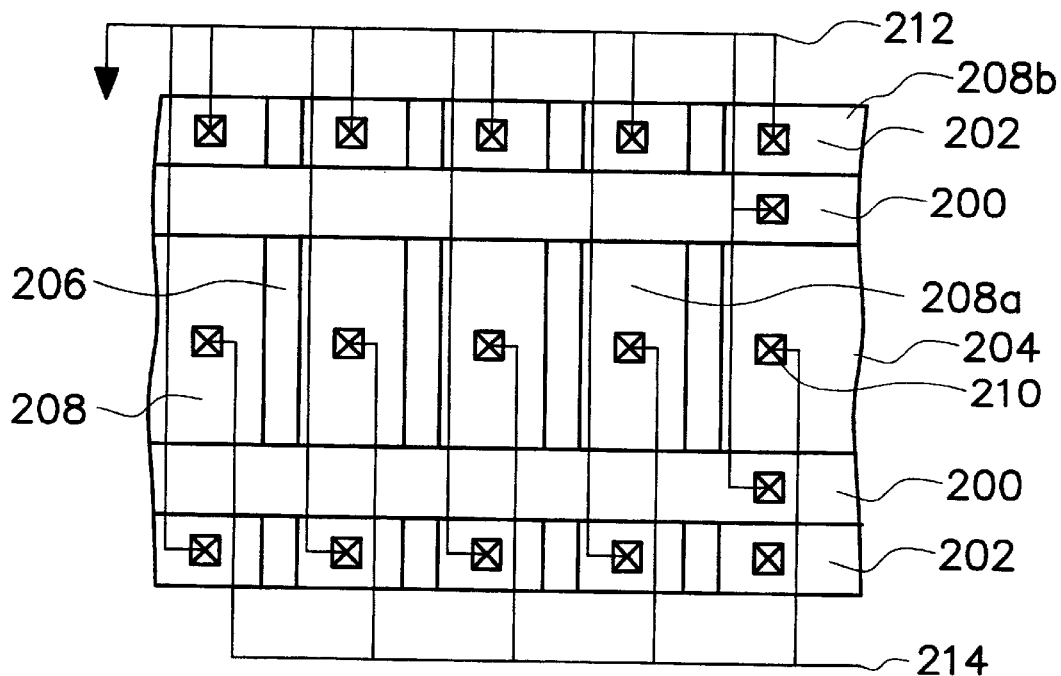
FIG. 2 is a schematic, top view of a transistor in an electrostatic discharge protective circuit in a preferred embodiment according to the invention.

FIG. 2 is a schematic, top view of a transistor in an electrostatic discharge protective circuit in a preferred embodiment according to the invention. The transistor comprises a gate electrode 200, a source 202, a drain 204 and several isolation structures 206, wherein the source 202 and the drain 204 are respectively formed at each side of the gate electrode 200, and the source 202, the drain 204 and the gate electrode 200 are parallel with each other. Each of the isolation structures 206 is formed partially or fully in the source 202 and the drain 204 so as to respectively separate the source 202 and the drain 204 into several regions 208b and 208a. From the top view, the isolation structures 206, for example, likes line bars formed in parallel but the line bars are, for example, perpendicular to the gate electrode 200. In FIG. 2, the isolation structures 206, for example, fully cross over the source 202 and the drain 204. A structure with partially crossing is to be described later in FIG. 3. Moreover, the transistor further comprises several contacts 210 respectively formed on the gate electrode 200, the drain regions 208a and the source regions 208b. The contacts 210 are used to electrically connect the transistor to an external ESD protective circuit to perform ESD. The contacts 210 are also used as conductive media between gate electrode 200 and a voltage line 212, between the drain 204 and an input line 214, and between the source 202 and the voltage line 212. The voltage line 212 can be a ground, for example. The source 202 and the gate electrode 200 connect the voltage line 212 through the respective contacts 210 on source regions 208b and on the gate electrode 200. The drain 204 connects the input line 214 through the respective contacts 210 on the gate electrode 200 and the drain regions 208a. The isolation structures 206 includes, for example, a field oxide structure or a shallow trench isolation structure. In the preferred embodiment, every drain region 208a and every source region 208b each preferably has at least one contact.

A current induced by electrostatic discharge disperses and flows to each of the drain regions 208a of the drain 204 through the contacts 210, and forward to the source 202. Since the isolation structures 206 electrically isolate the drain regions 208a from each other, the currents cannot flow to each other between every drain region 208a. Thereafter, the currents flow to each source region 208b from the respective drain regions 208a through channels (not shown), which are controlled by the gate electrode 200. Hence, the current induced by the electrostatic discharge does not excessively focus at some contacts in the source 202 due to defect of the gate electrode 200. The isolation structures 206 cause the current to uniformly flow through the gate electrode 200. If some drain regions 208s or related region have structure defects, the current does not focus on those defects. The conventional local high temperature effect on the transistor or the damages to the wafer structure can be avoided. In the other words, the efficacy of the usage of the transistor can be greatly increased since the current flows from the drain 204 to the source 202 through most of the channels. Therefore, the effect of the ESD protective circuit can be greatly enhanced.

Figure 3:
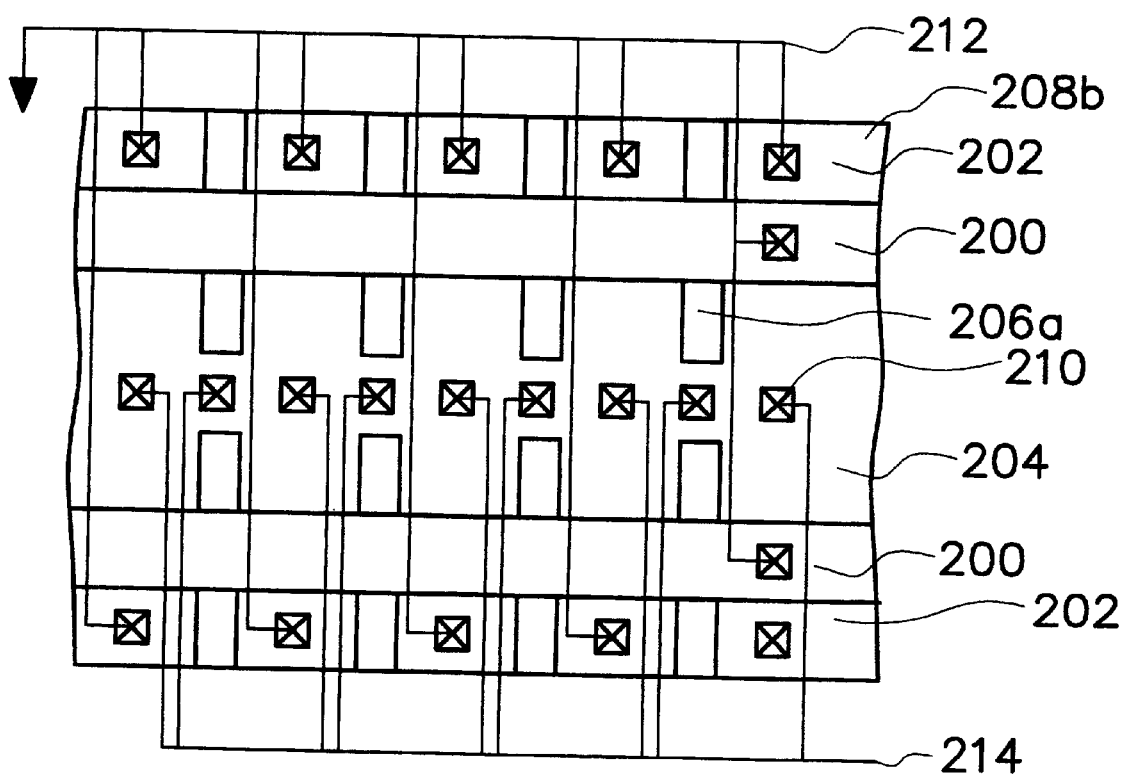
FIG. 3 is a schematic, top view of a transistor in an electrostatic discharge protective circuit in another preferred embodiment according to the invention.

FIG. 3 is a schematic, top view of a transistor in an electrostatic discharge protective circuit in another preferred embodiment according to the invention. The structure of the transistor in FIG. 3 is similar to that in FIG. 2. For simplicity, the structure of the transistor in FIG. 3 is not described again and the marks in FIG. 3 are the same as those in FIG. 2.

As shown in FIG. 3, isolation structures 206a only extend into a portion of a drain 204. Preferably, the isolation structures 206a is extending from both sides of the drain 204 but the isolation structures 206a only divide the drain 204 into several conductive regions without full isolation. This differs from the structure of the transistor in FIG. 2 but has the same purpose to disperse the current. With the same property, the isolation structures 206a can also just sufficiently extend only from one side so as to divide the current into several sub-currents. The isolation structures 206a, preferably, still fully isolate a source 202 into several source regions 208b. Although the structure of the isolation structures 206a cannot limit the current in the isolated conductive regions (as shown in FIG. 2), the extending isolation structures 206a also can slightly disrupt the direction of the current flow. Hence, the current flow from the drain 204 to the source 202 is relatively uniform. Accordingly, the local high temperature effect of the transistor caused by the excessively focused current can be avoided. The effect of using the transistor can be greatly increased since the current flows from the drain 204 to the source 202 through most of the channels. Therefore, the effect of the ESD protective circuit can be greatly enhanced.

In the examples of FIGS. 2 and 3, the isolation structures are preferably formed in bar-like structures, which are aligned on a direction preferably perpendicular to the gate electrode 200. In a general scope, the isolation structures are used to divide each of the source and the drain into several regions, which can also be fully isolated to each other. Through the contacts on those corresponding regions, the current induced by the electrostatic charges can be effectively dispersed into several sub-currents flowing through the transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protective circuit, comprising:
    a gate electrode;
    a drain at a first side of the gate electrode;
    a source at a second side of the gate electrode opposite to the first side, wherein the gate electrode, the drain and the source together form a transistor;
    a plurality of isolation structures beside the gate electrode and respectively isolating the drain and the source into a plurality of drain regions and source regions, wherein the isolation structures are aligned along a direction perpendicular to the gate electrode and penetrate through the gate electrode; and
    a plurality of contacts respectively on the gate electrode, the drain regions and the source regions.

2. The electrostatic discharge protective circuit of claim 1, wherein each of the drain regions and each of the source regions respectively has at least one of the contacts.

3. The electrostatic discharge protective circuit of claim 1, wherein the isolation structures are bar-like structures.

4. The electrostatic discharge protective circuit of claim 1, wherein the isolation structures include field oxide layer structures.

5. The electrostatic discharge protective circuit of claim 1, wherein the isolation structures include shallow trench isolations.

6. The electrostatic discharge protective circuit of claim 1, wherein the contacts on the source and on the gate electrode respectively connect to a ground.

7. The electrostatic discharge protective circuit of claim 1, wherein the contacts on the source and on the gate electrode respectively connect to a voltage line.

8. The electrostatic discharge protective circuit of claim 1, wherein the contacts on the drain connect to an inlet line.

9. The electrostatic discharge (ESD) protective circuit of claim 1, wherein the contacts are used to connect the transistor to an external portion of the ESD protective circuit.

10. An electrostatic discharge protective circuit, comprising;
   a gate electrode;
   a drain at one side of the gate electrode;
   a source at another side of the gate electrode, wherein the gate electrode, the drain and the source together form a transistor;
   a plurality of isolation structures beside the gate electrode, wherein the isolation structures isolate the source into a plurality of source regions and extending into a sufficient portion of the drain from a side of the gate electrode so as to form a plurality of drain regions, which are not completely isolated to each other, wherein the isolation structures are aligned along a direction perpendicular to the gate electrode and penetrate through the gate electrode; and
   a plurality of contacts respectively on the gate electrode, the drain regions and the source regions, wherein each drain region and each source region respectively has at least one contact, wherein the contacts are used to connect the transistor to an external portion of the ESD protective circuit.

11. The electrostatic discharge protective circuit of claim 10, wherein the isolation structures includes field oxide layer structures.

12. The electrostatic discharge protective circuit of claim 11, wherein the isolation structures includes shallow trench isolations.

13. The electrostatic discharge protective circuit of claim 11, wherein the contacts on the source and on the gate electrode respectively connect to a ground.

14. The electrostatic discharge protective circuit of claim 11, wherein the contacts on the source and on the gate electrode respectively connect to a voltage line.

15. The electrostatic discharge protective circuit of claim 11, wherein the contacts on the drain connect to an inlet line.

16. The electrostatic discharge protective circuit of claim 11, wherein each of the isolation structures comprises a bar-like structure.

* * * * *